United States Patent
Orr

(10) Patent No.: US 9,134,359 B2
(45) Date of Patent: Sep. 15, 2015

(54) POWER GENERATING COMPONENT CONNECTIVITY TESTING

(75) Inventor: Raymond Kenneth Orr, Kanata (CA)

(73) Assignee: SOLANTRO SEMICONDUCTOR CORP., Ottawa, Ontario (CA)

( * ) Notice: Subject to any disclaimer, the term of this patent is extended or adjusted under 35 U.S.C. 154(b) by 35 days.

(21) Appl. No.: 14/003,579

(22) PCT Filed: Mar. 8, 2012

(86) PCT No.: PCT/CA2012/050141
§ 371 (c)(1),
(2), (4) Date: Sep. 6, 2013

(87) PCT Pub. No.: WO2012/119258
PCT Pub. Date: Sep. 13, 2012

(65) Prior Publication Data
US 2013/0342216 A1 Dec. 26, 2013

Related U.S. Application Data

(60) Provisional application No. 61/450,831, filed on Mar. 9, 2011.

(51) Int. Cl.
*G01R 31/04* (2006.01)
*G01R 31/319* (2006.01)
(Continued)

(52) U.S. Cl.
CPC .......... *G01R 31/04* (2013.01); *G01R 31/31917* (2013.01); *H01L 31/02021* (2013.01); *H02S 50/00* (2013.01); *H02S 50/10* (2014.12); *G01R 31/026* (2013.01); *Y02E 10/50* (2013.01)

(58) Field of Classification Search
CPC .......... G01R 31/04; G01R 31/026; G01R 31/31917; H01L 31/02021; H02S 50/00; H02S 50/10; Y02E 10/50
USPC .......... 324/538, 537, 500
See application file for complete search history.

(56) References Cited

U.S. PATENT DOCUMENTS 8,587,251 B2 * 11/2013 Nakashima et al. .......... 320/101
2008/0106250 A1 5/2008 Prior et al.
(Continued)

FOREIGN PATENT DOCUMENTS

DE 20 2008 012 345 U1 3/2009
WO 2009091349 A2 7/2009
(Continued)

OTHER PUBLICATIONS

PCT International Search Report and Written Opinion completed by the ISA/CA on May 16, 2012 and issued in connection with PCT/CA2012/050141.
(Continued)

*Primary Examiner* — Hoai-An D Nguyen
(74) *Attorney, Agent, or Firm* — Barnes & Thornburg LLP

(57) ABSTRACT

Power generating component connectivity testing methods and apparatus are disclosed. At a power generating component, a connectivity testing condition is detected. A connectivity testing procedure is performed on detection of the connectivity testing condition, to test connectivity in a system that includes the power generating component and an unpowered electrical system. Connectivity is tested before the electrical system is connected to a power grid. An indication of connectivity can be provided by receiving connectivity information indicating connectivity between power generating components and the unpowered electrical system; and providing a representation of the connectivity between the power generating components and the electrical system. This representation could include, for example, one or more of: a connectivity alert, a visual representation of the power generating components; and a visual representation of the electrical system.

20 Claims, 4 Drawing Sheets

(51) Int. Cl.
*H01L 31/02* (2006.01)
*G01R 31/40* (2014.01)
*H02S 50/10* (2014.01)
*G01R 31/02* (2006.01)

(56) References Cited

U.S. PATENT DOCUMENTS

| | | |
|---|---|---|
| 2009/0020151 A1 | 1/2009 | Fornage |
| 2010/0085670 A1 | 4/2010 | Palaniswami et al. |
| 2011/0032099 A1 | 2/2011 | Giesler |
| 2011/0050237 A1 | 3/2011 | Sekizaki |
| 2011/0204900 A1* | 8/2011 | Beck .............................. 324/537 |
| 2012/0187767 A1* | 7/2012 | Kanno et al. .................... 307/82 |
| 2013/0066569 A1* | 3/2013 | Sato ................................ 702/60 |
| 2014/0118014 A1* | 5/2014 | Orr et al. ........................ 324/713 |

FOREIGN PATENT DOCUMENTS

| | | |
|---|---|---|
| WO | 2011/144649 A1 | 11/2011 |
| WO | 2012/010598 A1 | 1/2012 |

OTHER PUBLICATIONS

Honeywell Owners Manual "Solar PV AC SmartGride Module" SM0012-240. May 11, 2010.
Extended European Search Report dated Aug. 8, 2014; Application No. 12 755 020.0; European Patent Office; 7 pages.

* cited by examiner

POWER GENERATING COMPONENT CONNECTIVITY TESTING

CROSS REFERENCE TO RELATED APPLICATIONS

This application is a U.S. national counterpart application of international application Ser. No. PCT/CA2012/050141 filed Mar. 8, 2012, which claims priority to U.S. Provisional Patent Application No. 61/450,831 filed Mar. 9, 2011. The entire disclosures of PCT/CA2012/050141 and U.S. Ser. No. 61/450,831 are hereby incorporated by reference.

FIELD OF THE INVENTION

This invention relates generally to electrical systems and, in particular, to testing connectivity between power generating components and an unpowered electrical system.

BACKGROUND

Building Integrated Photovoltaic (BIPV) Alternating Current (AC) solar modules are connected to an AC bus as they are installed by a tradesperson. During this time, the AC bus is not yet connected to the electrical power grid. The connection of the AC bus to the power grid is made at a later time by an electrician, following installation of all of the BIPV modules and connection of those modules to the AC bus.

Prior to connection of the AC bus to the power grid, connectivity of the BIPV modules to the AC bus should be confirmed. According to one technique, a monitoring device that is connected to the AC bus is used to verify the system connections, but after the AC bus has already been connected to the power grid and AC power is applied. This type of system monitoring approach, however, has several disadvantages. For example, the installer of the BIPV modules cannot confirm connectivity as modules are installed, before connection to the electrical grid. Also, upon connection of the AC bus to the power grid, a five minute delay must pass, to comply with anti-islanding requirements, before any BIPV module becomes active and reports connectivity. If a problem exists, this five minute delay must pass following disconnection and reconnection of the AC bus or the addition of any BIPV module that was not properly connected. Furthermore, the electrician handling connection of the AC bus to the power grid has no mechanism to verify connectivity other than inspection prior to application of the power grid voltage to the AC bus.

In the case of Direct Current (DC) BIPV panels, voltage is typically generated whenever a panel is irradiated, even before the panel is connected to an electrical bus. Panels are "live" during installation, and after the first panel is connected, the electrical bus also becomes live, presenting a potential danger to an installer. In addition, the DC voltages present can be several hundred volts. Electrical trades people are typically unfamiliar with these voltages, hence specially licensed installers are required which increases the cost of PV installation.

SUMMARY

A method includes: detecting a connectivity testing condition at a power generating component; and performing a connectivity testing procedure on detection of the connectivity testing condition, the connectivity testing procedure testing connectivity in a system comprising the power generating component and an unpowered electrical system.

The power generating component could be a PV module, for example.

Examples of the connectivity testing condition include: a solar flux level stimulus where the power generating component is a PV module; receipt of a testing alert signal from a further power generating component; and receipt of a testing command signal from a connectivity monitoring device or another power generating component.

In some embodiments, the method also includes reporting a result of the connectivity testing procedure to a connectivity monitoring device.

The connectivity testing procedure could involve: outputting a test signal to an electrical system interface that enables connection of the power generating component to the electrical system; measuring an effect of the test signal in the electrical system; and determining, based on the measured effect, whether the power generating component is connected to the electrical system and/or a number of power generating components connected to the electrical system. The test signal and the measured effect could be a current and a voltage, respectively; or a voltage and a current, respectively.

Another possible connectivity testing procedure involves: transmitting a testing alert signal to a further power generating component; outputting a test signal to an electrical system interface that enables connection of the power generating component to the electrical system; and monitoring for a detection signal from the further power generating component indicating detection of the test signal on the electrical system at the further power generating component.

In some embodiments, the connectivity testing condition is receipt of a testing alert signal from a further power generating component, and the connectivity testing procedure involves monitoring the electrical system at the power generating component for a test signal output to the electrical system by the further power generating component; and transmitting a detection signal to the further power generating component on detection of the test signal on the electrical system at the power generating component.

A power generating component is provided, and includes: a power generator; and a connectivity testing module, operatively coupled to the power generator, to detect a connectivity testing condition at the power generating component, and to perform a connectivity testing procedure on detection of the connectivity testing condition, the connectivity testing procedure testing connectivity in a system comprising the power generating component and an unpowered electrical system.

The power generating component could be a PV module that includes, as the power generator, a PV unit with one or more PV cells. A PV system may include: an electrical system; and multiple PV modules.

The power generating component could also include a controller to control operation of the power generating component, with the controller including the connectivity testing module.

Examples of the connectivity testing condition are described above.

In some embodiments, the power generating component includes an interface, operatively coupled to the connectivity testing module, to enable the connectivity testing module to report a result of the connectivity testing procedure to a connectivity monitoring device. The interface could include one or more of: a wireless communication interface to enable communications between the power generating component and the connectivity monitoring device over a wireless link; a wired communication interface to enable communications between the power generating component and the connectivity monitoring device over a wired link; an electrical system interface to enable connection of the power generating component to the electrical system; and a local interface to enable communications between the connectivity testing module and the connectivity monitoring device.

Where the power generating component includes an electrical system interface to enable connection of the power generating component to the electrical system, the connectivity procedure could involve: outputting a test signal to the electrical system interface; measuring an effect of the test signal in the electrical system; and determining, based on the measured effect, whether the power generating component is connected to the electrical system, and/or a number of power generating components connected to the electrical bus system.

The power generating component could include: an interface, operatively coupled to the connectivity testing module, to enable the connectivity testing module to communicate with a further power generating component that includes a further connectivity testing module to detect a further connectivity testing condition at the further power generating component, and to perform a further connectivity testing procedure on detection of the further connectivity testing condition; and an electrical system interface to enable connection of the power generating component to the electrical system.

The connectivity testing procedure might then involve: transmitting a testing alert signal to the further power generating component through the interface; outputting a test signal to the electrical system through the electrical bus interface; and monitoring for a detection signal from the further power generating component indicating detection of the test signal on the electrical system at the further power generating component, with the further connectivity testing condition being receipt of the testing alert signal at the further power generating component, and the further connectivity testing procedure involving: monitoring the electrical system at the further power generating component for the test signal; and transmitting the detection signal to the power generating component on detection of the test signal on the electrical system at the further power generating component.

Another option for the further connectivity testing procedure where these interfaces are provided involves: transmitting a testing alert signal to the power generating component; outputting a test signal to the electrical system at the further power generating component; and monitoring for a detection signal from the power generating component indicating detection of the test signal on the electrical system at the power generating component, with the connectivity testing condition being receipt of the testing alert signal at the power generating component through the interface, and the connectivity testing procedure involving: monitoring the electrical system at the power generating component for the test signal; and transmitting the detection signal to the further power generating component through the interface on detection of the test signal on the electrical system at the power generating component.

According to another aspect of the present disclosure, a method involves: receiving connectivity information indicating connectivity between power generating components and an unpowered electrical system; and providing a representation of the connectivity between the power generating components and the electrical system. A related apparatus includes: an interface to enable communications with one or more power generating components of a plurality of power generating components; a user interface device; and a connectivity monitor, operatively coupled to the interface and to the user interface device, to receive through the interface connectivity information from the one or more power generating components indicating connectivity between the plurality of power generating components and an unpowered electrical system, and to provide through the user interface device a representation of the connectivity between the plurality of power generating components and the electrical system.

The power generating components may include PV modules.

The method could involve transmitting a connectivity testing command to one or more of the power generating components to initiate a connectivity testing procedure at the one or more power generating component, with the connectivity testing procedure generating the connectivity information. Similarly, the interface could further enable the connectivity monitor to transmit a connectivity testing command to the one or more power generating components, with the connectivity testing command initiating a connectivity testing procedure at the one or more power generating components, the connectivity testing procedure generating the connectivity information.

The representation could include one or more of: a connectivity alert; a visual representation of the power generating components; and a visual representation of the electrical system.

Other aspects and features of embodiments of the present invention will become apparent to those ordinarily skilled in the art upon review of the following description.

BRIEF DESCRIPTION OF THE DRAWINGS

Examples of embodiments of the invention will now be described in greater detail with reference to the accompanying drawings.

DETAILED DESCRIPTION

Figure 1:
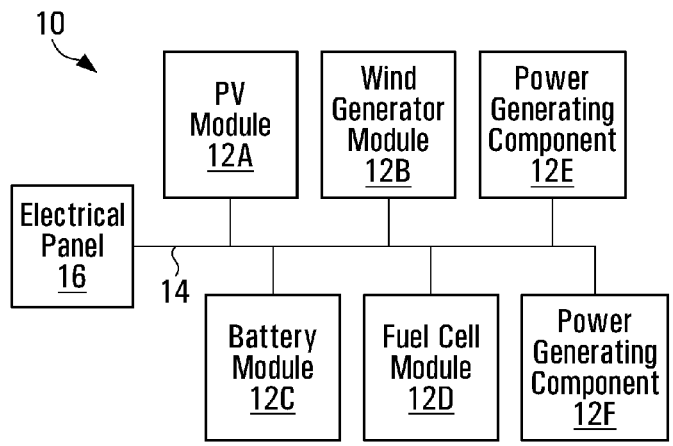
FIG. 1 is a block diagram of an example system including an electrical system and connected power generating components.

The present application discloses techniques and apparatus for a tradesperson to confirm connectivity of power generating components, such as AC or DC PV modules, as those components are connected to an electrical system. Additionally, a mechanism is provided for an electrician handling connection of the electrical system to an electrical power grid to confirm connectivity of power generating components prior to connection of the electrical system to the grid.

Several limitations of existing solutions can thereby be avoided. This provides significant benefits in the form of reduced installation time, reduced trouble-shooting time, and the enablement of less skilled installers to verify their installation.

The following features may be provided in at least some embodiments:
- ability to test power generating component connectivity to the electrical system without power grid presence
- an installer can confirm each power generating component's connectivity to the electrical system prior to connection to an electrical breaker or fuse panel by an electrician an electrician can confirm that all power generating components are connected to their respective buses in an electrical system prior to connecting to the power grid elimination of any anti-islanding wait period to confirm connectivity, where the power generating components include PV panels a connectivity monitoring device such as a portable system monitor carried by the installer or electrician that provides connectivity alerts (e.g., a "beep" and/or other audible, visual, tactile, or other form of connectivity alert) when a PV module is connected and/or displays a PV module map a brief, low voltage signal produced by a power generating component and applied to the electrical system to confirm its connectivity (e.g., in one embodiment, a wireless message with a power generating component unique ID is transmitted by the power generating component at the start of a test sequence, a test signal is then generated and applied to the electrical system, the electrical system is monitored at one or more other power generating components that receive the wireless message, and a connectivity acknowledge message is sent by one or more previously connected power generating components on detection of the test signal; in the case of a PV module for instance, the test signal might include ten cycles of a 10 Hz, 1V, squarewave generated when no power grid is present after insolation (solar flux) is constant for more than 10 seconds a connectivity acknowledge signal could be transmitted to and received by a connectivity monitoring device and a representation of power generating component connectivity could then be provided to the installer.

Verifying connectivity of power generating components as they are connected to an unpowered electrical system prior to connection of the electrical system to the power grid may have several components:

1/ power at each power generating component to enable "intelligent" control to test and signal connectivity could be derived from any of various sources, such as a battery or other form of energy storage device, self-generated power where the power generating component includes a power generator—in the case of a PV module for instance, power for connectivity testing could be derived from the power generated by the PV module from ambient light 2/ a mechanism to test connectivity to the electrical system without the presence of the power grid or other power generator to power the electrical system 3/ a mechanism to signal to the tradesperson the confirmation of connectivity as each power generating component is connected to the electrical system.

According to one embodiment, the impedance of the electrical system is measured or calculated as each power generating component is connected. The impedance measurement or calculation could be performed by an existing power generating component that is already connected to the electrical system, by a new power generating component that is being connected to the electrical system, and/or by a separate connectivity testing device. A power generating component in the form of a PV module, for example, might include one or more PV cells as a power generator, a power converter, and an Electromagnetic Interference (EMI) filter in the case of an AC PV module. The capacitance of the EMI filter in each PV module presents a characteristic impedance to the electrical system, allowing an existing connected power generating component or a separate connectivity testing device to detect the connection of additional PV modules, and/or allowing a PV module to detect that it has been connected to the electrical system. Other types of power generating components similarly present an impedance when connected to an electrical system, and thus could be detected and/or detect their own connectivity to the electrical system in the same manner.

Another embodiment employs a test signal sent from one power generating component and received at a second or multiple power generating components to verify the connection of the power generating component to the electrical system.

In respect of signalling power generating component connections, a connectivity monitoring device such as a portable wireless monitoring device to be carried by the tradesperson, could receive a signal confirming each connection and indicate each connection with a representation of the power generating component(s) or the electrical system on a display, a visual connectivity alert such as a message or one or more lights that flash and/or change color, an audible connectivity alert such as a tone, a tactile connectivity alert such as a vibration, and/or some other form of connectivity alert or indication. Signalling over the electrical system itself, to a battery powered connectivity monitoring device carried by the tradesperson for example, could also or instead be used to provide for connection verification to the tradesperson. This type of connectivity monitoring device would be connected to the electrical system at an available connection point. In this case, a power line modem at a power generating component, capable of sending and receiving information across the electrical system, could be used both to test connectivity between the power generating components by sending a signal from one power generating component and receiving that signal at a second or more power generating components, and also to report connectivity to the connectivity monitoring device. Another possible option to provide confirmation of power generating component connectivity as power generating components are installed could use a connectivity monitoring device in a power generating component that produces an audible, visual, tactile, or some other form of connectivity alert or signal, when the power generating component is connected to an electrical system. The installer could then confirm connectivity without carrying a portable connectivity monitoring device.

The use of a wireless signal for signalling between power generating components and/or for signalling between power generating components and the connectivity monitoring device could provide for enhanced features, in that the tradesperson may confirm that a power generating component is functional for generating power even when it is not connected to the electrical system. This provides more trouble-shooting capability when a connection to a power generating component is not complete. Wireless signalling could include Radio Frequency (RF) communications, but other types of wireless signalling are also contemplated. For example, wireless signalling could use one or more of: acoustic, electromagnetic, optical, and electrostatic techniques, and/or other techniques that allow information to be exchanged over some sort of wireless path or link.

FIG. 1 is a block diagram of an example system 10, including power generating components 12A through 12F connected to an electrical system 14 in the form of an electrical bus in this example. The electrical system 14 is connected to an electrical panel 16 in this example, which in turn is connected to a power grid. The electrical panel 16 may include one or more breakers, fuses, and/or switches, and the structure of the electrical panel may vary depending on how the electrical system 14 is interconnected with the power grid and other systems. For instance, the electrical panel 16 could connect the electrical system 14 to different numbers of circuits in a building electrical supply system in different installations. In some implementations, the electrical system 14 is an AC bus. In some implementations, the electrical system 14 could include a parallel DC bus connecting one or more DC PV panels to the electrical panel 16. The electrical panel 16 could then include one or more inverters to convert DC on the electrical system 14 into AC for connection to a power grid and/or building electrical supply system.

Although FIG. 1 shows an electrical system 14 in the form of the single electrical bus, an electrical system could include multiple buses. For example, an electrical system could include separate electrical buses, with each bus having respective power generating components connected.

In the example system 10, the PV module 12A, the wind generator module 12B, the battery module 12C, and the fuel cell module 12D represent illustrative examples of power generating components. Another example of a power generating component is a module that includes one or more flywheels. These particular examples are self-powered power generating components at which power may be available for connectivity testing. Power for connectivity testing could also or instead be provided separately. For example, a separate power generator such as a battery bank could be used to provide power for connectivity testing at the wind generator module 12B in the absence of wind. Other types of power generating components, represented generally at 12E and 12F, could similarly generate their own power and possibly be provided with alternate power generator(s) and perform connectivity testing as disclosed herein.

FIG. 1 also illustrates that a system 10 may include more than one type of power generating component. In some deployments, a system might be a PV system that includes only PV panels 12A connected to an electrical system 14. It should be appreciated that the teachings of the present disclosure could be implemented in a system that includes power generating components of one type or multiple types.

Figure 2:
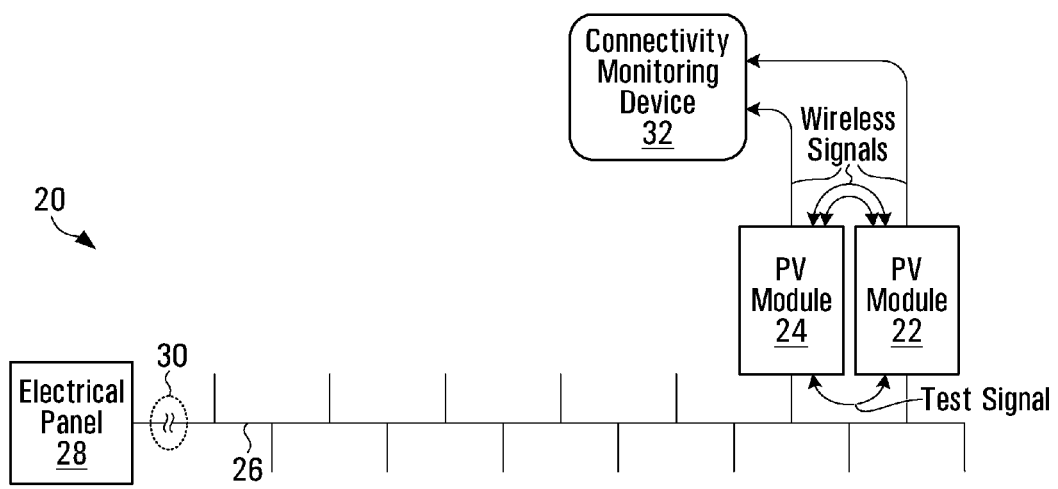
FIG. 2 is a block diagram of another example system.
Figure 6:
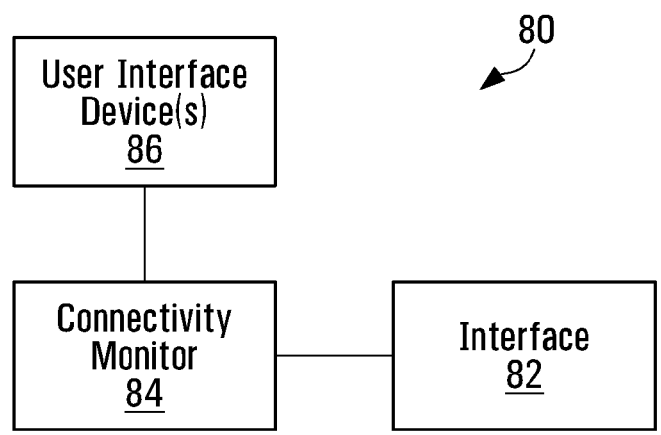
FIG. 6 is a block diagram of an example connectivity monitoring device.

FIG. 2 is a block diagram of another example system 20, in this case a PV system with two PV modules 22, 24 connected to an electrical system 26. The example system 20, like the example system 10, includes an electrical panel 28 for connecting the electrical system 26 to a power grid, but in FIG. 2, this connection has not yet been made. This is shown in FIG. 2 at 30. The electrical system 26 in FIG. 2 is thus unpowered by any external source, and is electrically isolated from a power grid. The system 20 also includes a connectivity monitoring device 32, an example of which is shown in FIG. 6 and described below. Although the example system 20 is a PV system with power generating components in the form of the PV modules 22, 24, this is solely for the purposes of illustration. Connectivity testing as disclosed herein may be applied to other types of power generating components.

As noted above, connection of power generating components such as the PV modules 22, 24 to the electrical system 26 may be tested or confirmed through impedance measurement or calculation and/or a signalling mechanism in which a signal is sent between the PV modules before a test signal is applied to the electrical system.

In one impedance testing embodiment, a test signal current is applied to the electrical system 26 by a PV module 22, 24. That PV module 22, 24 then measures the voltage on the electrical system 26 while the test signal current is applied. The number of PV modules 22, 24 connected to the electrical system 26 may then be determined based on a characteristic impedance $Z_{Out}$ of each PV module and parallel connection of the PV modules, in accordance with the following:

$$V_{Meas} = Z_{Out}/N \times I_{test}$$

where $V_{Meas}$ is the measured voltage on the electrical system $Z_{Out}$ is the impedance that each PV module presents to the electrical system N is the number of PV modules connected to the electrical system $I_{test}$ is the test signal current.

An equivalent relationship using an applied test voltage ($V_{test}$) and a measured current ($I_{Meas}$) could be used in another impedance testing embodiment.

In the case of an existing PV panel that has already been connected to an electrical system, the test signal could be applied and the voltage or current measurement could be taken periodically, and/or responsive to a command or other control event, to detect connection of additional PV panels. If N is higher, or $V_{Meas}$ is lower, or $I_{Meas}$ is higher than in a previous test/measurement cycle, then one or more additional PV modules have been connected in the electrical system.

A PV module that is being connected to the electrical system could also employ this type of mechanism to test its own connectivity. If N is determined to be greater than one, then connectivity of the PV module to the electrical system is confirmed. Alternately if the measured voltage $V_{Meas}$ meets the condition $$V_{Meas} \leq Z_{Out}/2 \times I_{test}$$

or the measured current meets the condition $$I_{Meas} \geq 2 \times V_{test}/Z_{Out}$$

then connectivity of at least the new PV module to the electrical system is confirmed.

In the example shown in FIG. 2, the PV modules 22, 24 communicate with the connectivity monitoring device 32 wirelessly. $V_{Meas}$ or $I_{Meas}$, calculated impedance, N, and/or an indication confirming PV module connection to the electrical system 26 could be transmitted to the monitoring device 32 by the PV modules 22, 24. Calculations to determine connectivity could potentially be performed at the PV modules 22, 24, at the connectivity monitoring device 32, or both the PV modules and the connectivity monitoring device could perform calculations. For example, in one possible embodiment, the PV modules 22, 24 could calculate impedance to confirm their own connectivity, and transmit the calculated impedance values to the connectivity monitoring device 32, which could use the impedance values to confirm N.

Precisely determining N through impedance testing might be feasible for installations involving a relatively small number of PV modules 22, 24. As the number of PV modules 22, 24 increases, total impedance decreases, and connection of additional PV modules could become difficult to detect. A signalling "talk-and-listen" approach as described herein avoids this issue.

In a talk-and-listen embodiment, a testing alert signal is sent from one PV module, the PV module 22 for instance, to one or more other PV modules, such as the PV module 24. In one embodiment the testing alert signal is sent wirelessly.

The testing alert signal alerts the PV module 24 that it should monitor the electrical system 26 for a test signal from the PV module 22. The PV module 22 applies a test signal comprising a distinct voltage waveform (e.g., 10 cycles of a 10 Hz, 1V, squarewave as noted above) to the electrical system 26 in one embodiment, and that distinct voltage waveform is detected on the electrical system by the other PV module 24 if both PV modules are connected properly. A detection signal is then sent to the first PV module 22 by the second PV module 24, confirming receipt of the distinct voltage waveform on the electrical system 26 at the second PV module 24. Receipt of the detection signal by the first PV module 22 confirms that the PV module is connected to the electrical system 26.

The talk-and-listen mechanism could be repeated by each PV module in a PV system periodically after a solar flux stimulus is steady for a certain period of time, until it receives a detection signal from at least one other PV module that is connected to an electrical system.

Comparing these two approaches, whereas the impedance testing approach involves no additional communication prior to the test, a large number of PV modules results in a very small signal. In a talk-and-listen implementation, signal amplitude is independent of the number of PV modules, but a separate communication path is provided in some embodiments to carry testing alert signals. However, the same type of communication path used for the testing alert signal (or the actual test signal in the case of a power line modem implementation) could be used to signal connectivity information to a tradesperson and/or electrician through a connectivity monitoring device, thereby avoiding an additional cost that might be incurred to provide a connectivity signalling mechanism in an impedance testing implementation. The talk-and-listen approach involves interaction between PV modules. No such interaction is involved in the impedance testing approach.

In one embodiment, the talk-and-listen mechanism could be applied to a form of the impedance testing approach, in which a known test current (or voltage) is sourced from one PV module and voltage (or current) is then measured at another PV module. The test signal in this example is a known test current or voltage and not necessarily a distinct waveform, and monitoring the electrical system for the test signal involves measuring voltage or current. Connectivity can be confirmed through any of the techniques described above for the impedance testing approach, and a signal confirming connectivity can be returned to the new PV module. The source PV module and/or the measuring PV module could provide an indication of connectivity and/or other information such as measured voltage/current and calculated impedance to the connectivity monitoring device 32.

Other variations in the impedance testing approach and the talk-and-listen approach are also contemplated. For example, as noted above the impedance testing approach could be performed by a new PV module that is being connected to the electrical system and/or by an existing PV module to detect connection of additional PV modules. The talk-and-listen approach could similarly be repeated by an existing PV module to request that any newly connected PV modules detect it and return confirmation of detection.

The foregoing description of FIG. 2 can be extended to other types of power generating components. A power generating component that is self-powered or has some other source of power, and/or a powered connectivity monitoring device, could test connectivity in an unpowered electrical system. This could include testing connectivity of a power generating component itself, and/or other power generating components. Power generating components need not be of the same type. A connected PV module, for example, could detect subsequent connection of a fuel cell module or other type of power generating component.

Figure 3:
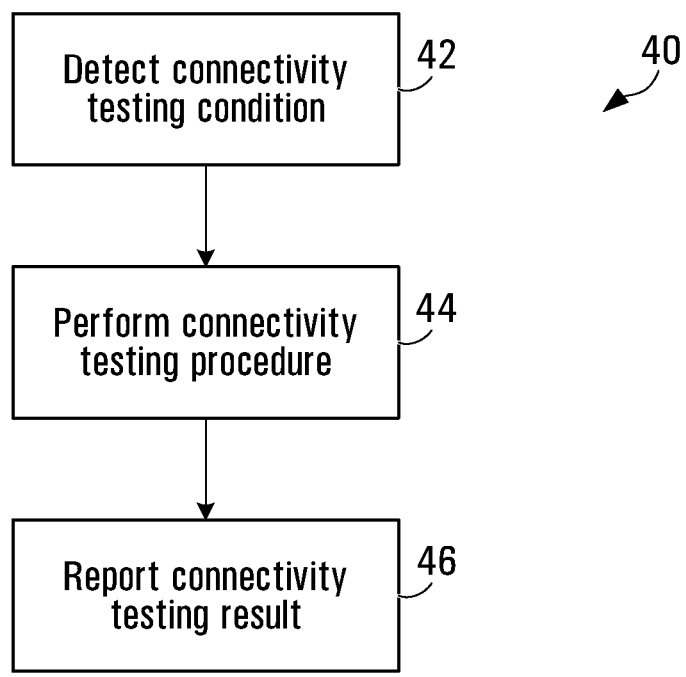
FIG. 3 is a flow diagram of an example method.

FIG. 3 is a flow diagram of an example method. The example method 40 involves detecting a connectivity testing condition at a power generating component, such as a PV module, as shown at 42, and performing a connectivity testing procedure at 44, on detection of the connectivity testing condition. The connectivity testing procedure tests connectivity in a system that includes the power generating component and an electrical system. As shown at 46, the example method 40 could also include reporting a result of the connectivity testing procedure to a connectivity monitoring device. In one embodiment, connectivity testing at the power generating component is terminated once the power generating component's connectivity is confirmed. In other embodiments, connectivity testing is repeated, to enable the power generating component to detect connection of additional power generating components to the electrical system.

The example method 40 is intended for illustrative purposes only. The operations shown in FIG. 3 may be performed in any of various ways, and other embodiments may include further, fewer, and/or different operations than those in the example method 40.

For instance, in one embodiment, the power generating component is a PV module, and the connectivity testing condition is a solar flux level stimulus at the PV module. As noted above, connectivity testing could be initiated after insolation is constant for more than 10 seconds. The connectivity testing condition, at a "receiving" power generating component in a talk-and-listen embodiment, could be receipt of a testing alert signal from another power generating component. In another embodiment, connectivity testing could be initiated by a connectivity monitoring device or another power generating component, in which case the connectivity testing condition could be receipt, at the power generating component, of a testing command signal from the connectivity monitoring device or the other power generating component.

An impedance testing method would involve outputting a test signal to an electrical system interface that enables connection of the power generating component to the electrical system. The electrical system interface could be a physical connector or conductor, for example. If the electrical system interface is connected to the electrical system, then the test signal is applied to the electrical system. An effect of the test signal at the electrical system interface is then measured. Based on the test signal and the measurement, the power generating component could determine whether it has been connected to the electrical system, and/or a number of power generating components connected to the electrical system. This test and measure technique could also or instead be employed by an existing power generating component that was previously connected to the electrical system, to detect connection of additional power generating components.

As described above, the test signal and the measured effect could be a current ($I_{test}$) and a voltage ($V_{Meas}$), respectively, or a voltage ($V_{test}$) and a current ($I_{Meas}$), respectively.

In a talk-and-listen embodiment, the connectivity testing procedure might involve transmitting a testing alert signal to one or more other power generating component(s), outputting a test signal to an electrical system interface that enables connection of the power generating component to the electrical system (which might be at least part of the testing alert signal where signalling between power generating components uses power line modems), and monitoring for a detection signal from the other power generating component(s) indicating detection of the test signal on the electrical system at the other power generating component(s).

At the other power generating component(s), the connectivity testing condition might be receipt of a testing alert signal from the power generating component, and the connectivity testing procedure involves monitoring the electrical system at the power generating component for a test signal (again, this signal could be at least part of the testing alert signal where signalling between power generating components uses power line modems) that is output to the electrical system by the power generating component, and transmitting a detection signal to the power generating component on detection of the test signal on the electrical system at the other power generating component.

According to another approach described above, one power generating component sources a test current (or voltage), and one or more other power generating components measure voltage (or current) in the electrical system.

Figure 4:
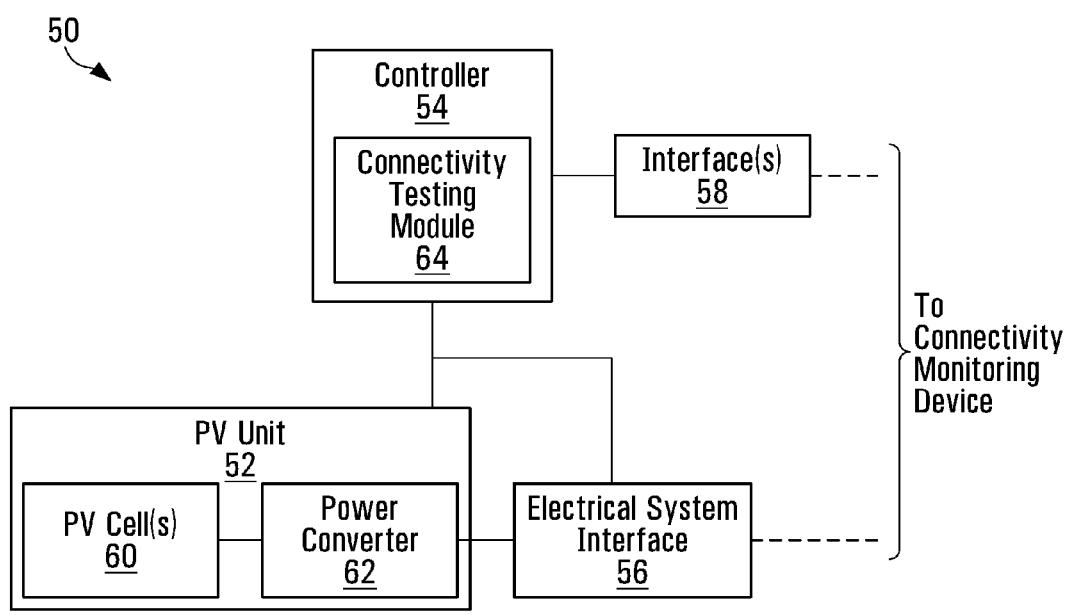
FIG. 4 is a block diagram of an example PV module.

FIG. 4 is a block diagram of an example PV module 50, which is an illustrative of one possible type of power generating component. The example PV module 50 is an apparatus that includes a PV unit 52, a controller 54, an electrical system interface 56, and optionally one or more other interfaces 58. The PV unit 52 includes one or more PV cells 60 and a power converter 62. The power converter 62 might include a DC to DC converter to change the voltage level supplied at the output of the PV cell(s) 60, and in the case of an AC PV unit 52, a DC to AC converter as well. In one possible implementation, DC to AC conversion is performed at a PV module. However, it should be appreciated that DC PV modules could instead be interconnected by a DC electrical system, with one or more DC to AC converters also being connected to the DC electrical system. Embodiments disclosed herein could be applied to either type of PV system.

The controller 54 in the example PV module 50 includes a connectivity testing module 64, although the connectivity testing module could be provided separately from the controller in other embodiments. Since the controller 54 would normally monitor current and/or voltage at the output of the power converter 62 and/or the electrical system interface 56, integration of connectivity testing into the controller 54 might enable existing measurement components and capabilities to be used for connectivity testing as well.

The electrical system interface 56 could include a connector and/or a conductor that enables connection of the PV unit 52 to an electrical system, such as the electrical system 26 in FIG. 2. An EMI filter could also be provided. The block 58 represents one or more additional interfaces, such as a wireless communication receiver and/or transmitter to enable receipt and/or transmission of testing alert signals, connectivity testing results, and/or connectivity testing command signals. These functions could be implemented using the same interface(s) or different interface(s). For example, in a power line modem implementation, a single power line modem operatively coupled to the electrical bus interface 56 may provide for any or all of these functions. In other embodiments, test signals are applied to the electrical system interface 56, and thereby to the electrical system if connected, and a different type of interface such as a wireless communication interface (e.g., a Radio Frequency (RF) interface or other type of interface), is used for testing alert signal and/or command signal reception and transmission and for reporting.

Interconnections between components of the example PV module 50 could vary between different implementations. For example, in some embodiments, the power converter 62 could be used to output a test signal to the electrical system interface 56. In this type of implementation, the controller 54 and/or the connectivity testing module 64 could be operatively coupled to the power converter 62. The test signal could instead be generated by a separate signal generator. In a power line modem communication embodiment, the interface(s) 58 could be operatively coupled to the electrical system interface 56, to enable the connectivity testing module 64 to send and/or receive testing alert signals.

In operation, the connectivity testing module 64 detects a connectivity testing condition at the PV module 50, and performs a connectivity testing procedure on detection of the connectivity testing condition. The connectivity testing procedure tests connectivity in a system that includes the PV module 50 and an electrical system. Illustrative examples of the connectivity testing condition are noted above.

The controller 54, in the embodiment shown, not only controls operation of the PV module 50, but also incorporates the connectivity testing module 64.

Reporting of a result of the connectivity testing procedure by the connectivity testing module could be through a wireless communication interface at 58 that enables communications between the example PV module 50 and a connectivity monitoring device over a wireless link, through a wired communication interface at 58 to enable communications between the example apparatus and the connectivity monitoring device over a wired link, and/or through the electrical system interface 56.

For impedance-based connectivity testing, the connectivity testing module 64 outputs (which could involve causing the power converter 62 to output) a test signal to the electrical system interface 56, and measures an effect of the test signal at the electrical system interface. Based on the test signal and the measurement, the connectivity testing module 64 could determine whether the PV module 50 has been connected to the electrical system, and/or a number of PV modules connected to the electrical system. This test and measure technique could also or instead be employed by an existing PV module that was previously connected to the electrical system, to detect connection of additional PV modules.

In a talk-and-listen embodiment, the PV module 50 could be undergoing connectivity testing. An interface 58 or 56 enables the connectivity testing module 64 to communicate with one or more other PV module(s), which may have the same structure as the example PV module 50. The connectivity testing module 64 transmits a testing alert signal to the other PV module(s) through the interface 58 or 56, outputs (which could involve causing the power converter 62 to output) a test signal to the electrical system through the electrical system interface 56, and monitoring for a detection signal from the other PV module(s) indicating detection of the test signal on the electrical system at the other PV module(s). At the other PV module(s), the connectivity testing module 64 detects, as a connectivity testing condition, receipt of the testing alert signal, and performs a connectivity testing procedure that involves monitoring the electrical system at the other PV module for the test signal, and transmitting the detection signal to the example PV module 50 on detection of the test signal on the electrical system.

The PV module 50 might also or instead participate in connectivity testing for another PV module. The connectivity testing module 64 would then detect receipt of a testing alert signal from another PV module through an interface 58 or 56, monitor the electrical system through the electrical system interface 56, and transmit a detection signal to the other PV module through an interface 58 or 56 on detection of the test signal.

Another manner in which the example PV module 50 might participate in connectivity testing for another PV module would be to transmit a testing command signal through an interface 58 or 56 to initiate connectivity testing by the other PV module. The example PV module 50 could similarly receive a testing command signal from another PV module through an interface 58 or 56.

Considering the reporting of results and/or other information to a connectivity monitoring device, a connectivity monitoring device could potentially be implemented as part of, or co-located with, the example PV module 50. For example, in embodiments where a PV module itself provides an indication of connectivity to an installer when it is connected to the electrical system, a connectivity monitoring device could be operatively coupled to the connectivity testing module through an internal interface or other local interface at 58. Such a connectivity monitoring device could include, for example, a display and/or a light source such as an LED to provide a visual connectivity alert, a sound generating device such as a speaker to provide an audible connectivity alert, and/or a mechanical element such as an electrical motor to produce a tactile connectivity alert.

The example PV module 50 provides an illustrative example of one type of power generating component that can perform connectivity testing. Other types of power generating components include, for example, wind generator module 12B, the battery module 12C, and the fuel cell module 12D (FIG. 1). These modules could have substantially the same structure as the example PV module 50 shown in FIG. 4 and operate in substantially the same way in respect of connectivity testing. Instead of the PV unit 52, a wind generator module might include a wind generator and possibly a power converter and/or a power generator. A battery module could similarly include a battery unit with one or more batteries as its power generator and a power converter, instead of a PV unit 52. In a fuel cell module, one or more fuel cells and possibly a power converter could be provided in a fuel cell unit which replaces the PV unit 52 in FIG. 4. Other types of power generating components with a connectivity testing module could derive power for the connectivity testing module from their own generated power and/or from a separate power generator, so that connectivity in an unpowered electrical system can be tested.

Figure 5:
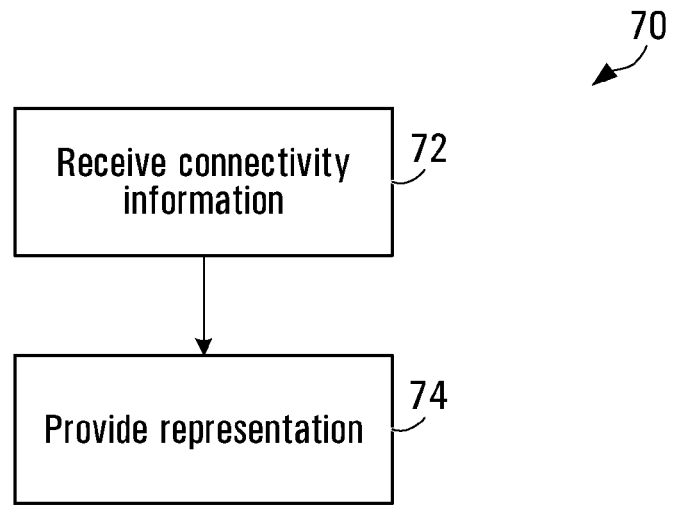
FIG. 5 is a flow diagram of another example method.

FIG. 5 is a flow diagram of another example method. The example method 70 involves receiving connectivity information at 72. The connectivity information indicates connectivity between power generating components and an electrical system. The method also involves providing a representation of the connectivity between the power generating components and the electrical system, as shown at 74.

In some embodiments, the method may involve fewer, additional, or different operations. For example, a connectivity testing command could be transmitted to one or more power generating components to initiate a connectivity testing procedure at the one or more power generating components, with the connectivity testing procedure generating connectivity information that is subsequently received at 72. The connectivity information might be in a form that is subject to further processing to determine connectivity. For example, a voltage measurement that is transmitted to a connectivity monitoring device by a power generating component could be further processed to determine how many power generating components are connected in an electrical system.

The representation provided at 74 could include, for example, a connectivity alert, a visual representation of the power generating components, and/or a visual representation of the electrical system.

FIG. 6 is a block diagram of an example connectivity monitoring device. The example connectivity monitoring device 80 is an apparatus that includes an interface 82 to enable communications with one or more power generating components of a plurality of power generating component, one or more user interface devices 86, and a connectivity monitor 84.

The interface 82 is compatible with an interface 56, 58 (FIG. 4) that is used by a PV module and/or other type of power generating component to communicate with a connectivity monitoring device as described above, and might include a wireless communication interface and/or a wired communication interface such as a power line modem. In some embodiments, a connectivity monitoring device is provided at a power generating component, and an interface at 82 could be compatible with an internal or other local interface at a power generating component.

The connectivity monitor 84 could be implemented using hardware, possibly in the form of a processor or other hardware component that executes software stored in a memory.

The user interface device(s) 86 provide outputs to a user, and might also accept inputs from a user. A speaker and/or a display screen could be used to provide a representation of power generating component connectivity to a user, and a touchscreen display could also accept user inputs, to initiate connectivity testing by one or more power generating components for example. One or more user interface device(s) at 86 could also or instead be used to provide connectivity alerts, such as audible, visual, and/or tactile connectivity alerts.

In operation, the connectivity monitor 84 receives, through the interface 82, connectivity information from one or more power generating components indicating connectivity between the plurality of power generating components and an electrical system. The connectivity monitor 84 communicates with one or more of the power generating components in a system through the interface 82, but need not necessarily communicate with every power generating component in a system. Through one or more of the user interface device(s) 86, the connectivity monitor 84 provides a representation of the connectivity between the plurality of power generating components and the electrical system, and/or one or more connectivity alerts. This representation could be in the form of a listing of power generating components, and/or a system map including the electrical system and any connected power generating components, for instance. Examples of connectivity alerts are provided above.

The interface 82 might also enable the connectivity monitor 84 to transmit a connectivity testing command to one or more power generating components, with the connectivity testing command initiating a connectivity testing procedure at the one or more power generating components to generate the connectivity information. The interface 82 could therefore support not only a receive function, but a transmit function as well.

In a simple implementation for integration into a power generating component, a connectivity monitoring device could be in the form of a user interface device 86 that is operatively coupled to a connectivity testing module 64 (FIG. 4). This type of implementation could be used to provide an installer with confirmation of connectivity as power generating components are connected to an unpowered electrical system.

Embodiments disclosed herein could be used to provide connectivity test functionality prior to connecting power generating components to an electrical grid. Generated power and/or a separate power source could be used to power the connectivity test functions prior to the availability of electrical grid power in an unpowered electrical system, which would only be available after connecting the electrical system to a power grid. A tradesperson can thereby be provided with a mechanism for testing connectivity as each power generating component is installed. Similarly, an electrician can be provided with a mechanism to test system connectivity before applying AC power. Results of connectivity testing can be made available to the tradesperson and the electrician via one or more connectivity monitoring devices, which could be integrated with power generating components and/or separate, possibly portable, devices. In some embodiments, wireless signalling is provided to signal between power generating components. Wireless signalling could also potentially be used to signal between power generating components and a portable monitoring device to incrementally test the system as power generating components are being installed.

What has been described is merely illustrative of the application of principles of embodiments of the invention. Other arrangements and methods can be implemented by those skilled in the art without departing from the scope of the present invention.

For example, methods according to other embodiments may include further, fewer, and/or different operations, performed in a similar or different order than shown in FIGS. 3 and 5. The divisions of function represented in FIGS. 4 and 6 are also illustrative, and accordingly apparatus implementations may include further, fewer, or different components, interconnected in a similar or different manner than explicitly shown in the drawings.

It should also be appreciated that the functions described herein could be implemented in any of various ways, in one or more processors executing software stored in computer-readable storage, Application Specific Integrated Circuits (ASICs), Programmable Logic Devices (PLDs), and/or Field Programmable Gate Arrays (FPGAs), for instance.

Another possible extension of connectivity testing as disclosed herein would be to control output of power from power generating components. For example, the connectivity testing module 64 (FIG. 4), or another element of the controller 64 could control the power converter 62, a switch, or other element to prevent power from being supplied to the electrical system interface 56 until a power generation condition is detected. The presence of a power grid, for instance, could be detected by monitoring the electrical system through the electrical system interface 56. Another possible option would be an explicit control mechanism whereby power is applied to the electrical system interface 56 responsive to a command signal or other indication from a connectivity monitoring device or other control device operated by an electrician.

In addition, although described primarily in the context of methods and systems, other implementations are also contemplated, as instructions stored on a non-transitory computer-readable medium such as a magnetic or optical disk or a solid state memory device, for example.

I claim:

1. A method comprising:
   detecting a connectivity testing condition by a power generating component; and
   performing a connectivity testing procedure by the power generating component on detection of the connectivity testing condition, the connectivity testing procedure testing connectivity in a system comprising the power generating component and an unpowered electrical system.

2. The method of claim 1, wherein the detecting comprises detecting the connectivity testing condition by a photovoltaic (PV) module that comprises the power generating component.

3. The method of claim 1, wherein the detecting comprises detecting one or more of the following as the connectivity testing condition:
   a solar flux level stimulus where the power generating component comprises a photovoltaic (PV) module;
   receipt of a testing alert signal by the power generating component from a further power generating component; and
   receipt of a testing command signal by the power generating component from a connectivity monitoring device or another power generating component.

4. The method of claim 1, further comprising:
   reporting, by the power generating component, a result of the connectivity testing procedure to a connectivity monitoring device.

5. The method of claim 1, the connectivity testing procedure comprising:
   outputting, by the power generating component, a test signal to an electrical system interface that enables connection of the power generating component to the electrical system;
   measuring, by the power generating component, an effect of the test signal in the electrical system; and
   determining, based on the measured effect, whether the power generating component is connected to the electrical system.

6. The method of claim 1, further comprising:
   outputting, by the power generating component, a test signal to an electrical system interface that enables connection of the power generating component to the electrical system;
   measuring, by the power generating component, an effect of the test signal in the electrical system; and
   determining, based on the measured effect, a number of power generating components connected to the electrical system.

7. The method of claim 1, further comprising:
   receiving, from the power generating component, connectivity information indicating connectivity between the unpowered electrical system and a plurality of power generating components including the power generating component; and
   providing a representation of the connectivity between the power generating components and the electrical system.

8. The method of claim 1, the connectivity testing procedure comprising:
   transmitting, by the power generating component, a testing alert signal to a further power generating component;
   outputting, by the power generating component, a test signal to an electrical system interface that enables connection of the power generating component to the electrical system; and
   monitoring, by the power generating component, for a detection signal from the further power generating component indicating detection of the test signal on the electrical system at the further power generating component.

9. The method of claim 1,
   wherein the detecting comprises detecting as the connectivity testing condition receipt of a testing alert signal by the power generating component from a further power generating component,
   wherein performing the connectivity testing procedure comprises:
   monitoring the electrical system by the power generating component for a test signal output to the electrical system by the further power generating component; and
   transmitting, by the power generating component, a detection signal to the further power generating component on detection of the test signal on the electrical system by the power generating component.

10. The method of claim 7, wherein the receiving comprises receiving connectivity information indicating connectivity between the unpowered electrical system and a plurality of photovoltaic (PV) modules comprising the plurality of power generating components.

11. The method of claim 7, wherein the providing comprises providing one or more of the following as the representation:
- a connectivity alert confirming connection of each of the power generating components to the electrical system;
- a visual representation of the power generating components; and
- a visual representation of the electrical system.

12. A power generating component comprising:
- a power generator; and
- a connectivity testing module, operatively coupled to the power generator, to detect a connectivity testing condition at the power generating component, and to perform a connectivity testing procedure on detection of the connectivity testing condition, the connectivity testing procedure testing connectivity in a system comprising the power generating component and an unpowered electrical system.

13. The power generating component of claim 12, the connectivity testing condition comprising one or more of:
- a solar flux level stimulus where the power generating component comprises a photovoltaic (PV) module;
- receipt of a testing alert signal by the connectivity testing module from a further power generating component; and
- receipt of a testing command signal by the connectivity testing module from a connectivity monitoring device or another power generating component.

14. The power generating component of claim 12, further comprising:
- an interface, operatively coupled to the connectivity testing module, to enable the connectivity testing module to report a result of the connectivity testing procedure to a connectivity monitoring device, the interface comprising one or more of:
- a wireless communication interface to enable communications between the power generating component and the connectivity monitoring device over a wireless link;
- a wired communication interface to enable communications between the power generating component and the connectivity monitoring device over a wired link;
- an electrical system interface to enable connection of the power generating component to the electrical system; and
- a local interface to enable communications between the connectivity testing module and the connectivity monitoring device.

15. The power generating component of claim 12, comprising a photovoltaic (PV) module, the PV module further comprising, as the power generator:
- a PV unit comprising one or more PV cells.

16. The power generating component of claim 12, further comprising:
- an electrical system interface to enable connection of the power generating component to the electrical system,
- the connectivity procedure comprising: outputting, by the connectivity testing module, a test signal to the electrical system interface; measuring, by the connectivity testing module, an effect of the test signal in the electrical system; and determining, based on the measured effect, whether the power generating component is connected to the electrical system.

17. The power generating component of claim 12, further comprising:
- an electrical system interface to enable connection of the power generating component to the electrical system,
- the connectivity procedure comprising: outputting, by the connectivity testing module, a test signal to the electrical system interface; measuring, by the connectivity testing module, an effect of the test signal in the electrical system; and determining, based on the measured effect, a number of power generating components connected to the electrical bus system.

18. The power generating component of claim 12, further comprising:
- an interface, operatively coupled to the connectivity testing module, to enable the connectivity testing module to communicate with a further power generating component, the further power generating component comprising: a further connectivity testing module to detect a further connectivity testing condition at the further power generating component, and to perform a further connectivity testing procedure on detection of the further connectivity testing condition; and
- an electrical system interface to enable connection of the power generating component to the electrical system,
- the connectivity testing procedure comprising: transmitting, by the connectivity testing module, a testing alert signal to the further power generating component through the interface; outputting, by the connectivity testing module, a test signal to the electrical system through the electrical bus interface; and monitoring, by the connectivity testing module, for a detection signal from the further power generating component indicating detection of the test signal on the electrical system by the further connectivity testing module at the further power generating component,
- the further connectivity testing condition comprising receipt of the testing alert signal by the further connectivity testing module at the further power generating component,
- the further connectivity testing procedure comprising: monitoring, by the further connectivity testing module, the electrical system at the further power generating component for the test signal; and transmitting, by the further connectivity testing module, the detection signal to the power generating component on detection of the test signal on the electrical system by the further connectivity testing module at the further power generating component.

19. The power generating component of claim 12, further comprising:
- an interface, operatively coupled to the connectivity testing module, to enable the connectivity testing module to communicate with a further power generating component, the further power generating component comprising: a further connectivity testing module to detect a further connectivity testing condition at the further power generating component, and to perform a further connectivity testing procedure on detection of the further connectivity testing condition; and
- an electrical system interface to enable connection of the power generating component to the electrical system,
- the further connectivity testing procedure comprising: transmitting, by the further connectivity testing module, a testing alert signal to the power generating component; outputting, by the further connectivity testing module, a test signal to the electrical system at the further power generating component; and monitoring, by the further connectivity testing module, for a detection signal from the power generating component indicating detection of the test signal on the electrical system by the connectivity testing module at the power generating component, the connectivity testing condition comprising receipt of the testing alert signal by the connectivity testing module at the power generating component through the interface, the connectivity testing procedure comprising: monitoring, by the connectivity testing module, the electrical system at the power generating component for the test signal; and transmitting, by the connectivity testing module, the detection signal to the further power generating component through the interface on detection of the test signal on the electrical system by the connectivity testing module at the power generating component.

20. Apparatus comprising:

an interface to enable communications with one or more power generating components of a plurality of power generating components;

a user interface device; and a connectivity monitor, operatively coupled to the interface and to the user interface device, to receive through the interface connectivity information from the one or more power generating components indicating connectivity between the plurality of power generating components and an unpowered electrical system, and to provide through the user interface device a representation of the connectivity between the plurality of power generating components and the electrical system, wherein the power generating components comprise photovoltaic (PV) modules.

\* \* \* \* \*